United States Patent [19]
McClure et al.

[11] Patent Number: 5,633,828
[45] Date of Patent: May 27, 1997

[54] CIRCUITRY AND METHODOLOGY TO TEST SINGLE BIT FAILURES OF INTEGRATED CIRCUIT MEMORY DEVICES

[75] Inventors: David C. McClure; Mark A. Lysinger, both of Carrollton; Frank J. Sigmund, Coppell; John A. Michlowsky, Carrollton, all of Tex.

[73] Assignee: SGS-Thomson Microelectronics, Inc., Carrollton, Tex.

[21] Appl. No.: 519,075

[22] Filed: Aug. 24, 1995

[51] Int. Cl.⁶ .................................................. G11C 7/00
[52] U.S. Cl. ............................................ 365/201; 365/190
[58] Field of Search ................................ 365/201, 190, 365/189.05, 203, 156

[56] References Cited

U.S. PATENT DOCUMENTS

| | | |
|---|---|---|
| 4,962,487 | 10/1990 | Suzuki ................................. 365/233.5 |
| 5,453,954 | 9/1995 | Nakamura ............................ 365/201 |
| 5,463,585 | 10/1995 | Sanada ................................. 365/201 |

*Primary Examiner*—Amir Zarabian
*Attorney, Agent, or Firm*—Theodore E. Galanthay; Lisa K. Jorgenson; Renee M. Larson

[57] ABSTRACT

According to the present invention, a structure and method provides for single bit failures of an integrated circuit memory device to be analyzed. According to the method for analyzing a single bit failure of an integrated circuit memory device, a test mode is entered, bitline load devices of the integrated circuit memory device are turned off, a single bit of the integrated circuit memory device is selected, the device is placed into a write mode, a plurality of bitlines true and a plurality of bitlines complement of the integrated circuit memory device not associated with the single bit are then set to a low logic level, the bitline true and the bitline complement associated with the single bit is connected to a supply bus and a supply complement bus which is connected to test pads. Finally, the electrical characteristics of the single bit can be monitored on the test pads. According to the structure of the present invention, bitline load devices of the integrated circuit memory device are controlled by a test mode signal, the state of which determines when the test mode will be entered. These bitline load devices are connected to the bitlines true and complement which in turn are connected to the memory cell. Select devices, such as column select transistors, are connected to the bitline true and bitline complement; they are also connected to driver circuitry by a bus, such as a write bus, a read bus or a write/read bus. The driver circuitry is supplied with supply voltages as well as data signals. Further, a buffer circuit allows bitlines true and bitlines complement not associated with the single bit being tested to be pulled to a logic low level. A dummy structure also provides the opportunity to directly monitor the bitlines of the integrated circuit memory device without the need for microprobing.

40 Claims, 5 Drawing Sheets

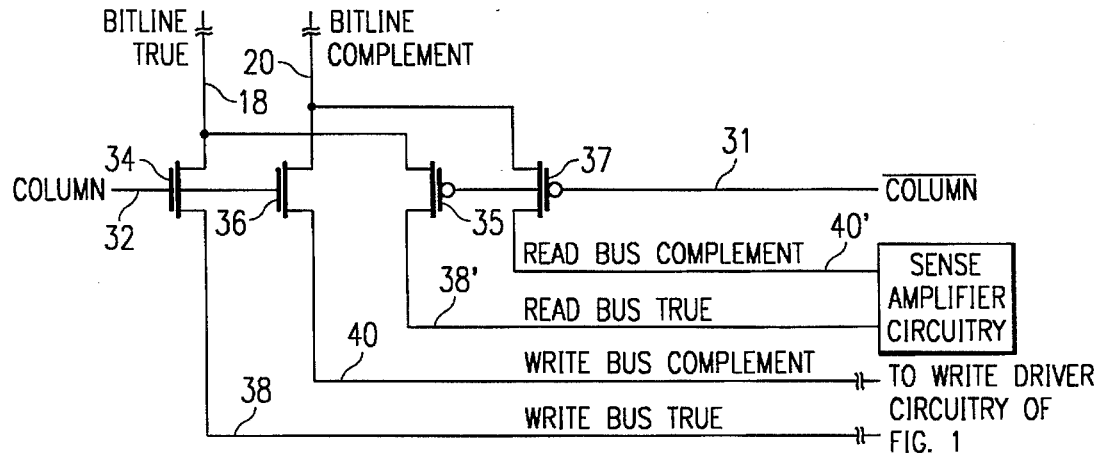
FIG. 1B
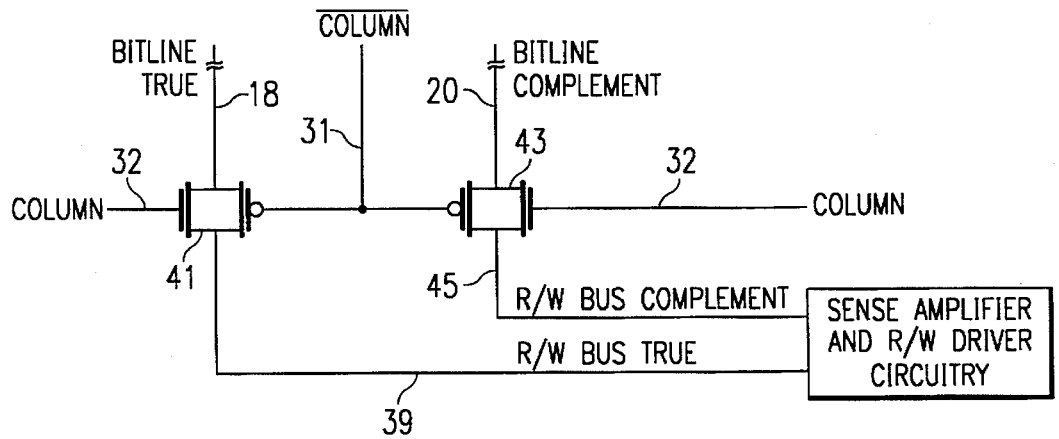
FIG. 1C
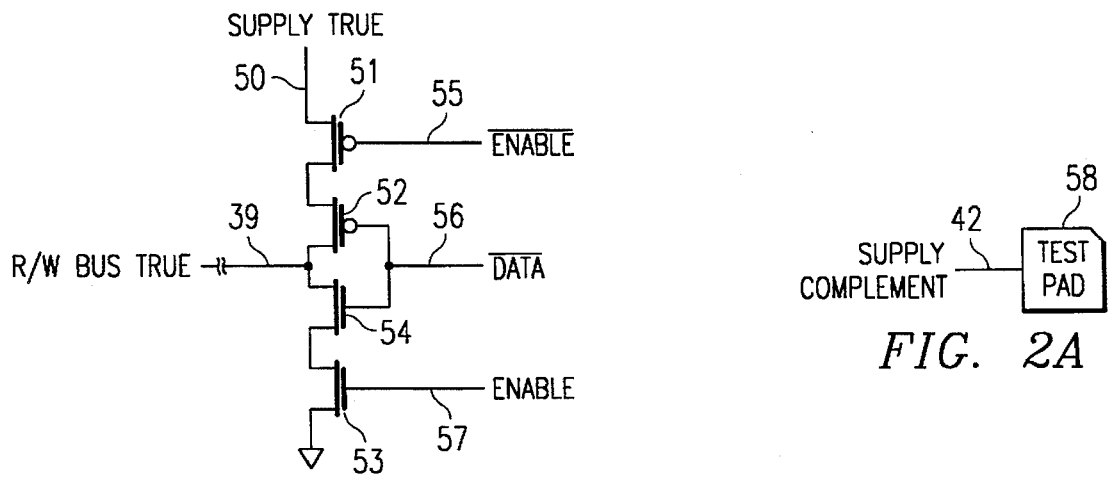
FIG. 1D
FIG. 2A

CIRCUITRY AND METHODOLOGY TO TEST SINGLE BIT FAILURES OF INTEGRATED CIRCUIT MEMORY DEVICES

BACKGROUND OF THE INVENTION

The present invention relates generally to single bit failures of integrated circuit memory devices, and more specifically to a circuitry and methodology to test single bit failures of integrated circuit memory devices.

Testing is performed throughout the manufacture and assembly of integrated circuit memory devices in order to ascertain their functionality and reliability. Testing of internal cell electrical measurements of integrated circuit memory devices is becoming more and more useful in determining the root cause of single bit failures of memory devices. Single bit failures may be caused by a variety of conditions, including intrinsic process or design problems such as a contact overetch condition, particle defects, shorts in circuitry, and mechanical damage to circuits such as photolithic defects.

The traditional method of internal cell electrical measurement in order to test single bits of an integrated circuit memory device is performed by first choosing a certain cell to be analyzed by some type of functional test. Next, Focused Ion Beam (FIB) and/or laser modifications are typically made to access and disconnect the cell to be tested from its associated loads and other circuitry which might otherwise taint the internal cell electrical measurements. FIB technology may be used to make contact to bitlines of an integrated circuit memory device, disconnecting column loads and measuring I-V (current-voltage) characteristics of the memory device while modulating FIB bitline pads. FIB technology may also be used to cut metal lines of the integrated circuit memory device or to deposit metal to reconnect broken metal lines or to construct a pad which may be probed on a die. Finally, tedious and time consuming internal microprobing of the cell is necessary to make actual measurements.

Since internal cell electrical measurement of single bit failures is currently performed manually and is thus very labor intensive, a test mode feature of an integrated circuit memory device which analyzes single bit failures would be very useful in the art.

SUMMARY OF THE INVENTION

It would be advantageous in the art to have a more efficient means to analyze single bit failures of an integrated circuit memory device.

Therefore, according to the present invention, a structure and method for analyzing single bit failures of an integrated circuit memory device is disclosed. According to the method for analyzing a single bit failure of an integrated circuit memory device, the integrated circuit memory device enters a test mode that is controlled by a test mode signal. Bitline load devices associated with a memory cell are then turned off. Next, a single bit of the integrated circuit memory device is selected and the integrated circuit memory device is placed into a write mode. A plurality of bitlines true and a plurality of bitlines complement of the integrated circuit memory device not associated with the single bit being tested are set to a low logic level. The bitline true and the bitline complement associated with the single bit is then connected to a supply true bus and a supply complement bus, respectively, which in turn are connected to test pads. Finally, the electrical characteristics of the single bit can be monitored on the test pads.

According to the structure of the present invention, bitline load devices of the integrated circuit memory device are controlled by a test mode signal, the state of which determines when the test mode will be entered. These bitline load devices are connected to the bitlines true and complement which in turn are connected to a memory cell. Select devices, such as column select transistors, are connected to the bitline true and bitline complement; they are also connected to driver circuitry by a true bus and a complement bus, such as a write bus, a read bus or a write/read bus. The driver circuitry is supplied with supply voltages true and complement as well as data true and data complement signals. Multiple placement of driver circuitry throughout the integrated circuit memory device shares use of one supply true bus and one supply complement bus. Further, a buffer circuit allows bitlines true and bitlines complement not associated with the single bit being tested to be pulled to a logic low level. A dummy structure also provides the opportunity to directly monitor the bitlines of the integrated circuit memory device without the need for microprobing.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

FIG. 1b is a schematic diagram of separate read and write bus circuitry, according to the present invention;

FIG. 1c is a schematic diagram of combined read and write bus circuitry, according to the present invention;

FIG. 1d is a schematic diagram of write driver circuitry to be used in conjunction with the circuitry of FIG. 1c, according to the present invention;

FIG. 2a is a schematic diagram of circuitry for physically connecting a supply bus to a test pad, according to the present invention;

DESCRIPTION OF THE INVENTION

The present invention provides a test mode and associated circuitry to perform diagnostic test exercises on single bits of the integrated circuit memory device in an efficient manner. This test mode is preferred over the traditional means of manually testing a single bit, namely the use of Focused Ion Beam (FIB) and laser technology. A variety of integrated circuit memory devices, including but not limited to such devices as SRAMs (Static Random Access Memory), FIFOs (First In First Out), DRAMs (Dynamic Random Access Memory), EPROMs (Electrically Programmable Read Only Memory) and logic devices which contain a memory, may use the present invention. Additionally, there are a number of other integrated circuit devices, such as microprocessors, RISCs (reduced instruction set chips), graphics chips, and controllers, with embedded memories which may contain the present invention.

Figure 1:
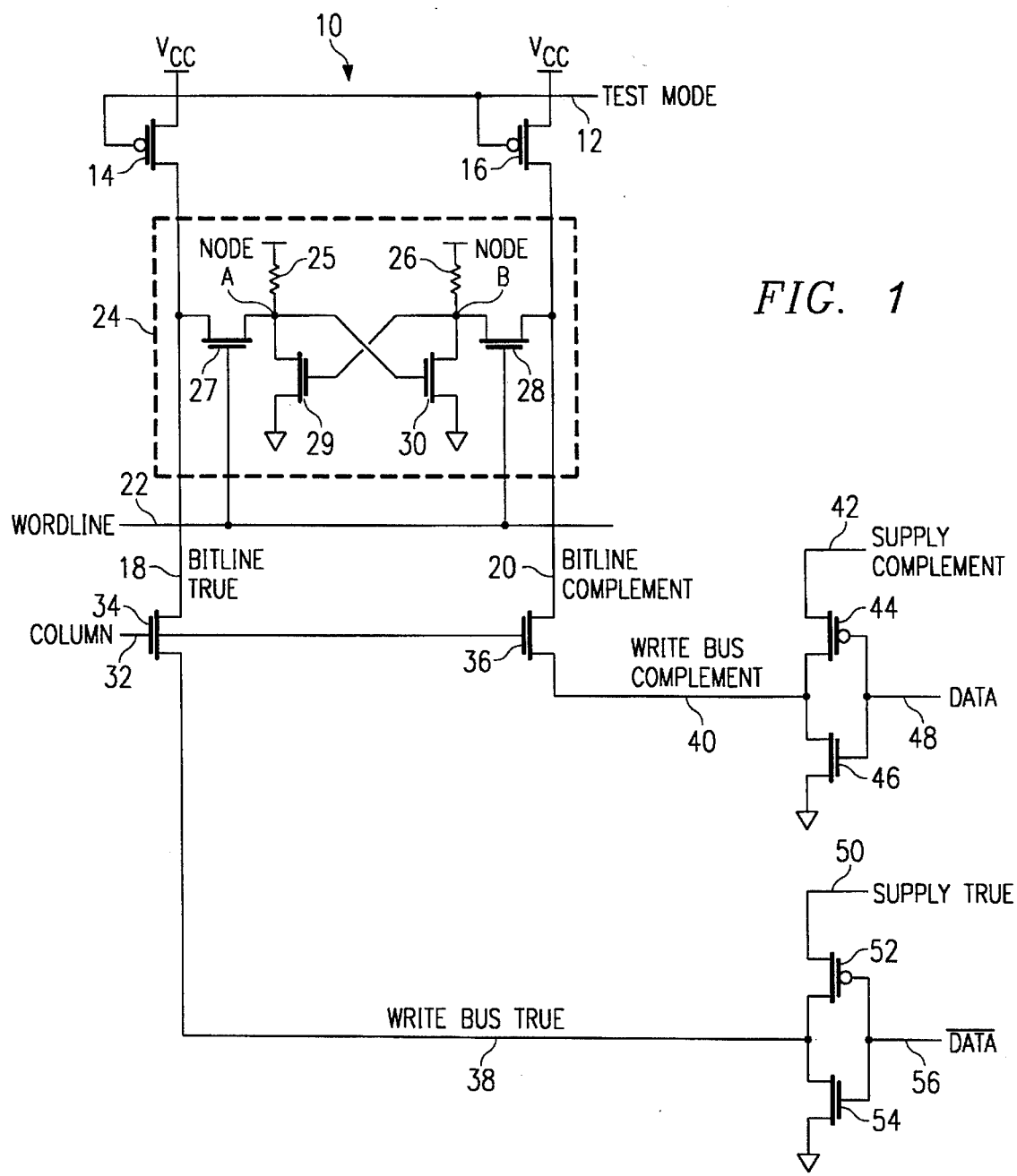
FIG. 1 is a schematic diagram of circuitry for testing single bits of an integrated circuit memory device, according to the present invention.

Referring to FIG. 1, circuitry 10 for testing single bits of an SRAM integrated circuit memory device is shown. The SRAM circuitry 10 of FIG. 1 is an example and the present invention is not meant to be limited to SRAMs. Test Mode signal 12 is provided to the gates of pull-up bitline load transistors 14 and 16; pull-up bitline load transistor 14 is connected to bitline true 18 while pull-up bitline load transistor 16 is connected to bitline complement 20 as shown. Memory cell 24 resides between bitline true 18 and bitline complement 20 and has the following components: resistors 25 and 26, and transistors 27, 28, 29, and 30. Resistor 25 is electrically connected at one terminal to a supply voltage such as Vcc and is electrically connected at the other terminal to Node A; a first terminal of resistor 26 is similarly electrically connected to a supply voltage like Vcc and electrically connected to Node B on a second terminal. Transistor 27 has a first source/drain which is electrically connected to bitline true 18, a second source/drain which is electrically connected to Node A, and a gate which is electrically connected to Wordline bus 22. Transistor 28 has a first source/drain which is electrically connected to bitline complement 20, a second source/drain which is electrically connected to Node B, and a gate which is electrically connected to Wordline bus 22. Transistor 29 has a first source/drain which is electrically connected to Node A, a second source/drain electrically connected to ground potential such as Vss, and a gate which is connected to Node B. Finally, transistor 30 has a first source/drain which is electrically connected to Node B, a second source/drain electrically connected to Vss, and a gate connected to Node A. As can be easily inferred from the above electrical connections, Node A is the electrical connection composed of the second source/drain of transistor 27, the second terminal of resistor 25, the first source/drain of transistor 29, and the gate of transistor 30; similarly, Node B is electrical connection composed of the second terminal of resistor 26, the second source/drain of transistor 28, the first source/drain of transistor 30, and the gate of transistor 29.

A first source/drain of column select transistor 34 is electrically connected to bitline true 18 while a second source/drain is electrically connected to Write Bus True 38. For column select transistor 36, a first source/drain of transistor 36 is electrically connected to bitline complement 20 while a second source/drain is electrically connected to Write Bus Complement 40. Column bus 32 is connected to the gates of column select transistors 34 and 36. Write Bus True 38 is electrically connected to the common node between transistors 52 and 54. Supply True bus 50 is provided to a source/drain of transistor 52 and Data Complement bus 56 is provided to the gates of both p-channel 52 and n-channel 54. A second source/drain of transistor 54 is electrically connected to ground potential or Vss. Write Bus Complement 40 is electrically connected to the common node between transistors 44 and 46. Supply Complement bus 42 is provided to a source/drain of transistor 44 and Data bus 48 is provided to the gates of p-channel transistor 44 and n-channel transistor 46. A second source/drain of transistor 46 is electrically connected to ground potential or Vss.

Figure 1A:
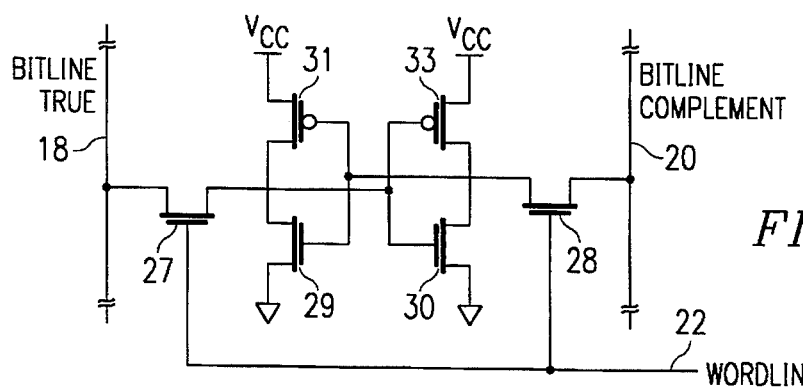
FIG. 1a is a schematic diagram of a 6T memory cell.

Memory cell 24 is commonly referred to as a Poly-R memory SRAM cell because resistors 25 and 26 are formed in a polycrystalline silicon layer of the integrated circuit memory device. Other memory cells, however, would be equally suitable for use in the present invention in place of memory cell 24 and may include a 6 transistor (6T) memory cell, a TFT (thin film transistor) memory cell, as well as other types of memory cells. These changes may be made to circuitry 10 with no significant changes to the present invention. For instance, referring to FIG. 1a, a 6T memory cell is shown. This memory cell also resides between bitline true 18 and bitline complement 20. There are still the transistors 27, 28, 29, and 30 of FIG. 1, with the gates of transistors 27 and 28 again connected to Wordline bus 22. The resistors 25 and 26 of FIG. 1 have been replaced with transistors 31 and 33 to make a 6T memory cell. The gates of transistors 29 and 31 are connected to a source/drain of transistor 28, while the gates of transistors 30 and 33 are connected to a source/drain of transistor 27.

The circuitry of FIG. 1 may be expanded to include a read bus as well as a write bus. Referring to FIG. 1b, in addition to Write Bus Complement 40 and Write Bus True 38 which connect to the write drivers, there may be a Read Bus Complement 40' and a Read Bus True 38' which connect to sense amplifier circuitry. Write Bus Complement 40 and Write Bus True 38 of FIG. 1 may also be connected to sense amplifier circuitry. Read Bus True 38' is connected to bitline true 18 through p-channel transistor 35 while Read Bus Complement 40' is connected to bitline complement 20 through p-channel transistor 37. The gates of p-channel transistors 35 and 37 are driven by Column Complement bus 31.

In addition, the write and read bus function may be combined into one true and complement bus as shown in FIG. 1c. Read and write bus functionality may be combined by forming a passgate on each bitline. Thus passgate 41 is electrically connected to bitline true 18 while passgate 43 is electrically connected to bitline complement 20. Both passgates 41 and 43 are controlled by Column bus 32 and Column Complement bus 31 as shown. Passgate 41 is connected to Read/Write Bus True 39 which is connected to a Read/Write True Driver, shown in FIG. 1d, and sense amplifier circuitry. Similarly, passgate 43 is connected to a Read/Write Complement Driver, like the driver circuitry shown in FIG. 1d, and sense amplifier circuitry.

Referring to FIG. 1d, an example of the driver circuitry to be used with FIG. 1c is shown. Read/Write Bus True 39 is connected to the Read/Write True Driver formed by transistors 52 and 54. Since the write driver must be tri-stated during a read cycle, Enable signal 57 and Enable Complement signal 55 are provided to the gates of transistors 53 and 51, respectively. A source/drain of transistor 51 is connected to Supply True bus 50 as shown. Enable signal 57 goes to a low logic state and Enable Complement signal 55 goes to a high logic state to disable the write driver. As was the case in FIG. 1, Data Complement bus 56 is provided to the gates of transistors 52 and 54. Read/Write Bus Complement 45 of FIG. 1c is connected to driver circuitry similar to that shown in FIG. 1d.

Figure 2B:
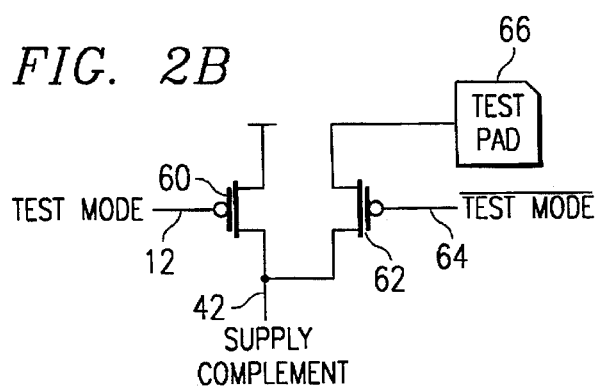
FIG. 2b is a schematic diagram of circuitry for connecting a supply bus to a test pad such that down-bonding is not required, according to the present invention.
Figure 2C:
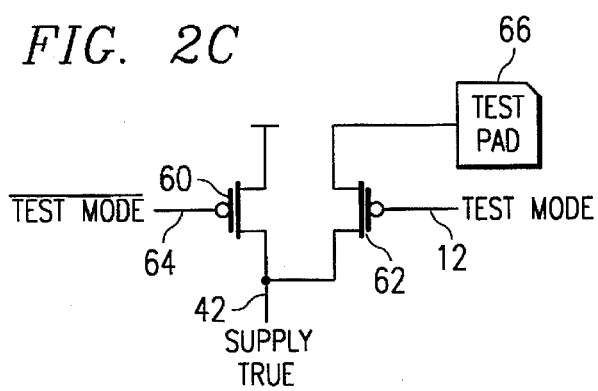
FIG. 2c is a schematic diagram of circuitry for connecting a supply bus to a test pad such that down-bonding is not required, according to the present invention.

Referring again to FIG. 1, both Supply Complement bus 42 and Supply True bus 50 are electrically connected to test pads which facilitate testing of a single bit of the integrated circuit memory device. Referring to FIG. 2a, a supply signal, such as Supply Complement bus 42, may be connected to a test pad 58 which may be ultimately down-bonded to Vcc. Another way of connecting a supply signal to a test pad such that down-bonding is not required is shown in FIG. 2b and FIG. 2c. Referring to FIG. 2b, Supply Complement bus 42 is connected to a first source/drain of switching transistors 60 and 62. A second source/drain of transistor 62 is connected to test pad 66. Test Mode signal 12 is supplied to the gate of p-channel transistor 60 and Test Mode Complement signal 64 is supplied to the gate of p-channel transistor 62 as shown. In a test mode, Test Mode signal 12 is a high logic level while Test Mode Complement signal 64 is a low logic level to connect test pad 66 to Supply Complement signal 42. Referring to FIG. 2c, Supply True bus 50 is connected to a first source/drain of switching transistors 60 and 62. A second source/drain of transistor 62 is connected to test pad 66. Test Mode Complement signal 64 is supplied to the gate of p-channel transistor 60 and Test Mode signal 12 is supplied to the gate of p-channel transistor 62. In test mode, Test Mode signal 12 is a high logic level while Test Mode Complement signal 64 is a low logic level to connect test pad 66 to Supply True signal 50.

As shown in FIG. 1, Write Driver True is formed by transistors 52 and 54 while Write Driver Complement is formed by transistors 44 and 46. The transistors forming the driver will invert the Data bus signal. There will be multiple write drivers, both true and complement, in any given integrated circuit memory device; the number of such write drivers will depend upon the size of the device. It is envisioned that there will be multiple placements of Write Driver True and Write Driver Complement for the integrated circuit memory device; however, all drivers of an integrated circuit memory device may connect either to a common supply true buss or to a common supply complement bus, respectively. Thus, Supply True bus 50 connects to the Write Driver True, associated with Bitline True 18, and comprised of transistors 52 and 54, and the Supply Complement bus 42 connects to the Write Driver Complement, associated with Bitline Complement 20, and comprised of transistors 44 and 46 for all columns of the integrated circuit memory device. It is important to note that an integrated circuit memory device could have more than one Supply True bus and more than one Supply Complement bus, such that one Supply True bus and one Supply Complement bus could service a designated portion of the integrated circuit memory device, such as the left side and the right side the device.

Test Mode signal 12 is a high true signal and thus goes to a high logic level when in the test mode, turning off bitline load transistors 14 and 16. If the switching transistors 60 and 62 of FIG. 2b are used, then the Vcc connection to Supply Complement bus 42 and Supply True bus 50 is turned off as well. The single bit to be tested is selected as a function of its row address and column address. Thus, Wordline bus 22 and Column bus 32 are both equal to a high logic state in order to select the single bit to be tested. After the single bit to be tested is selected, the integrated circuit memory device is put into a write mode. If the memory device is a ×8 memory device, a 8K×8 RAM for instance, then eight drivers would be active to pull down eight bitlines (bitline true 18 or bitline complement 20). While it is necessary to monitor the current of only one memory cell and thus one column, there is the problem that all drivers share the same Supply Complement bus 42 and Supply True bus 50. As the memory device becomes wider, wider than a 8K×8 RAM for example, it becomes correspondingly more burdensome to have a separate Supply Complement bus 42 and Supply True bus 50 for each data line; for example, a ×32 memory device would require 2×32, or 64, separate busses and test pads.

This difficulty of having a separate Supply Complement bus 42 and Supply True bus 50 is addressed by appropriate manipulation of bitlines of the integrated circuit memory device. Again assuming a ×8 memory device, the other seven drivers of the memory device not associated with the bit being tested are put into a test mode where both the bitlines true 18 and bitlines complement 20 associated with each driver are a logic low state. Both Data bus 48 and Data Complement bus 56 are equal to a high logic level, and Bitline True 18 and Bitline Complement 20 are equal to a low logic level, for the columns not associated with the single bit being tested. As a result, the other seven drivers of a ×8 memory device do not drive Supply True bus 50 or Supply Complement bus 42 onto Write Bus True 38 and Write Bus Complement 40 or onto bitline true 18 and bitline complement 20, respectively. Thus, Supply True bus 50 and Supply Complement bus 42 are isolated from Bitline True 18 and Bitline Complement 20, respectively, for these seven drivers. The eighth driver, associated with the single bit being tested, is not isolated from Bitline True 18 and Bitline Complement 20.

The column of the single bit being tested can then have its bitline true 18 and bitline complement 20 connected to Supply True bus 50 and Supply Complement bus 42, respectively. The test pad voltages can be swept and the current of each test pad monitored. When Data bus Complement 56 is equal to a low logic level, its Bitline True 18 is connected to Supply True bus 50; likewise when Data bus 48 is equal to a low logic level, its Bitline Complement 20 is connected to Supply Complement bus 42. In this way, modulation of a supply bus has the effect of modulating its associated bitline. Thus, the state of the data pin (DQ) of the memory device associated with the bit being tested, the state of Supply True bus 50, and the state of Supply Complement bus 42 control the voltage level of the bitlines of the memory cell in question.

A further requirement of the present invention is that both bitlines, bitline true 18 and bitline complement 20, of the single bit being tested must be modulated simultaneously which requires that both Data bus 48 and Data Complement bus 56 be equal to a low logic level at the same time. This may occur when the memory device is not in a write mode, but is instead in a read or chip deselect mode. Thus the integrated circuit memory device must be taken out of the write mode. Taking the memory device out of the write mode, however, may cause the sense amplifiers of the memory device to fire and disrupt the bitlines due to associated sense amplifier activity; thus, this approach may be problematic.

Another approach is to define the test mode during a write cycle such that a low logic level on the Output Enable (G complement) pin of the integrated circuit memory device drives normal data into the memory device with one bitline a low logic level and the other bitline a high logic level, while a high logic level on the Output Enable pin of the memory device causes both Data bus 48 and Data Complement bus 56 to be equal to a low logic level, thereby defining a pseudo read mode.

It should be noted that bitline true 18 and bitline complement 20 may be pulled as low as 0 volts via the driver pulldown n-channel transistors 54 and 46, respectively, when Data bus 48 or Data Complement bus 56 is a high logic level, or via $V_{TP}$ (the threshold voltage of a p-channel transistor) if the voltage level on either Supply True bus 50 or Supply Complement bus 42 is less than $V_{TP}$ when Data bus 48 or Data Complement bus 56 is a low logic level. If Supply True bus 50 or Supply Complement bus 42 is less than $V_{TP}$, the p-channel transistor of the write driver (transistor 52 or 44, respectively) turns off if the bitline voltage is below $V_{TP}$. When, however, Supply True bus 50 or Supply Complement bus 42 is greater than $V_{TP}$, bitline true 18 and bitline complement 20 follow the write driver but will be clamped by $V_{COL}-V_{TN}$ if only a n-channel passgate is used for write, where $V_{COL}$ is equal to the voltage of Column bus 32 and $V_{TN}$ is equal to the threshold voltage of the n-channel transistors. If the p-channel transistor is used to write as well, then clamping does not occur. Otherwise, Vcc is adjusted to achieve the desired voltage on the bitlines and may exceed 5 volts if needed. Additionally, when pulling both bitlines to a low logic level, memory cells adjacent to memory cell 24 will be maintained if all DQ's (data output pins of the integrated circuit memory device) are grouped together consecutively for consecutive bitlines and adjacent columns to the memory cell 24 are not selected to pull both bitlines low. Alternately, a bitline may be discharged to ground potential when its load transistor is off. As will be discussed later, these limitations are addressed by the circuitry of FIG. 4.

The present invention offers several ways to put seven of eight DQ's into such a "both bitlines low" mode, again assuming a ×8 integrated circuit memory device. For instance, the "both bitlines low" test mode could be loaded into registers within the Data In buffer of the memory device while in test mode or when test mode is entered. As an example, if DQ is a low logic level when the test mode is entered, this could get latched in, to denote "both bitlines low". If the DQ is a high logic level, this will denote the DQ to be modulated and no latching occurs so that this DQ can be exercised in the test mode. An example of such a Data In buffer circuit is shown in FIG. 3.

Figure 3:
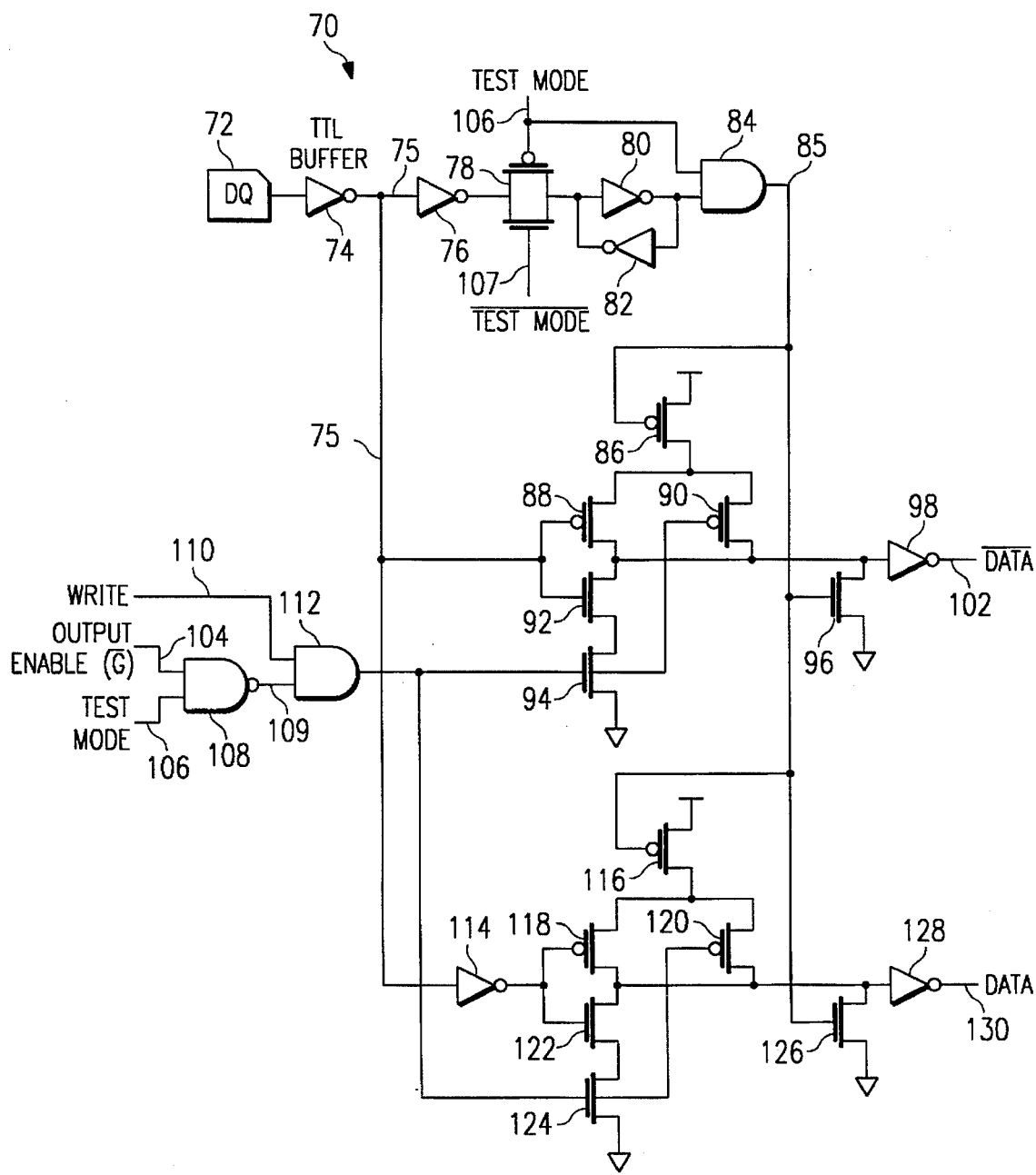
FIG. 3 is a schematic diagram of data in buffer circuitry, according to the present invention.

Referring to FIG. 3, Data In buffer circuitry 70 has the following components: DQ pad 72 which is connected to a DQ pin of the integrated circuit memory device (not shown), inverters 74, 76, 80, 82, 98, 114, 128, passgate 78, AND logic gates 84, 112, NAND logic gate 108, and transistors 86, 88, 90, 92, 94, 96, 116, 118, 120, 122, 124, 126. A DQ signal on DQ pad 72 passes through inverter 74 which serves as TTL (transistor transistor logic) buffer to Data In buffer circuitry 70. The output signal 75 of TTL buffer 74 serves as the input signal to inverters 76 and 114, as well as driving the gates of transistors 88 and 92. Similarly, output signal 75 passes through inverter 114 before driving the gates of transistors 118 and 122. Passgate 78 is controlled by Test Mode signal 106 and Test Mode complement signal 107 which determine when the output signal of inverter 76 will be inverted and then presented as an input signal to AND logic gate 84. Test Mode signal 106 is the second input signal to AND logic gate 84. A latch loop is formed by inverters 80 and 82. The output signal 85 of AND logic gate 84 drives the gates of p-channel pull-up transistors 86 and 116 and the gates of n-channel pull-down transistors 96 and 126.

Output Enable (G complement) signal 104 and Test Mode signal 106 are input signals to NAND logic gate 108; the output signal 109 of NAND logic gate 108 is a first input signal to AND logic gate 112, while Write signal 110 provides the second input signal to AND logic gate 112. As previously mentioned, a pseudo-read mode may be obtained by driving Output Enable signal 104, a low true signal, to a high logic level thereby leaving Data bus 130 and Data Complement bus 102 both equal to a low logic level.

The modifications to a normal Data In buffer embodied in the circuitry 70 of FIG. 3 need only be made if bitlines true or complement need to be modulated at a voltage not equal to ground potential. If either the bitline true or the bitline complement is equal to ground potential, then the data state of the other seven DQ signals throughout the integrated circuit memory device may be inverted through manipulation of their DQ pins so that only the DQ signal of interest is examined.

Figure 4:
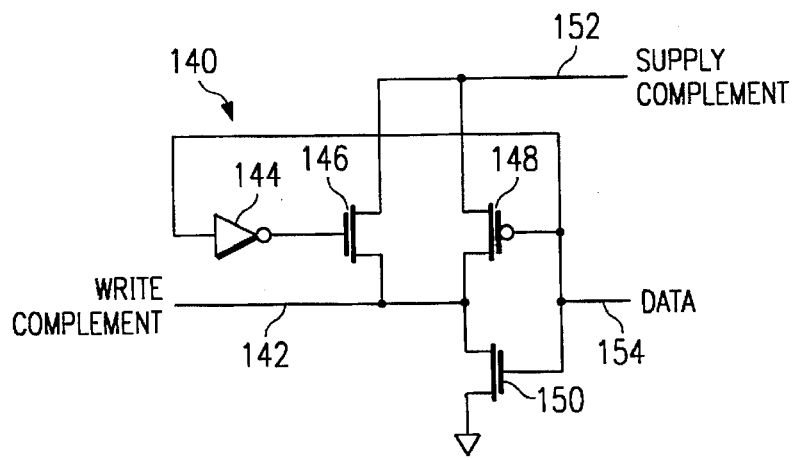
FIG. 4 is a schematic diagram of write driver circuitry which allows operation between 0 volts and $V_{TP}$, according to the present invention.

In the event there is difficulty in modulating the bitlines true and complement at 0 volts, and $_{TP} \leq V_{BL} \leq V_{CC}-V_{TN}$, then the write driver of FIG. 1 can be adjusted to allow operation between 0 volts and $V_{TP}$, as shown in FIG. 4. $V_{BL}$ is equal to the voltage of a bitline. The write driver circuitry 140 of FIG. 4 features a Supply Complement signal 152, analogous to the Supply Complement signal 42 of FIG. 1, which feeds a first source/drain of n-channel transistor 146 and p-channel transistor 148. A Write Complement bus signal 142 feeds a second source/drain of n-channel transistor 146 and p-channel transistor 148 as well as a first source/drain of pull-down transistor 150; a second source/drain of transistor 150 is connected to ground potential as shown. Data bus signal 154, analogous to Data bus signal 48 of FIG. 1, drives the gates of transistors 148 and 150 and also the gate of transistor 146 after being inverted by inverter 144. Write driver circuitry 140 of FIG. 4 allows operation of bitline voltage levels defined as: $0 \leq V_{BL} \leq V_{CC}-V_{TN}$.

Figure 5:
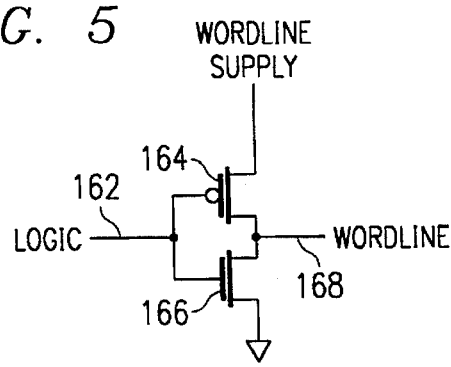
FIG. 5 is a schematic diagram of circuitry which connects the power supply of a wordline driver to a test pad for modulation, according to the present invention.

FIG. 5 illustrates that the power supply of the wordline driver, which drives the Wordline bus 22 of FIG. 1 for instance, may also be brought out to a pad for modulation as well. A Logic signal 162 drives the gates of transistors 164 and 166. A first source/drain of transistor 164 is connected to a Wordline Supply signal 164 (the power supply of the wordline driver), while a second source/drain of transistor 164 as well as a first source/drain of transistor 166 are connected to Wordline 168. A second source/drain of transistor 166 is connected to ground potential as shown.

In addition to the features discussed thus far, the present invention also allows a representative monitoring of an actual bitline voltage of interest without the necessity of microprobing the actual bitline in question. This is especially useful when it is necessary to verify the voltage on a particular bitline. For instance, it may be desirable to ascertain whether a given bitline has a particular voltage, such as $V_{CC}-V_T$. Representative monitoring may be accomplished using the dummy structure shown in FIG. 6.

Figure 6:
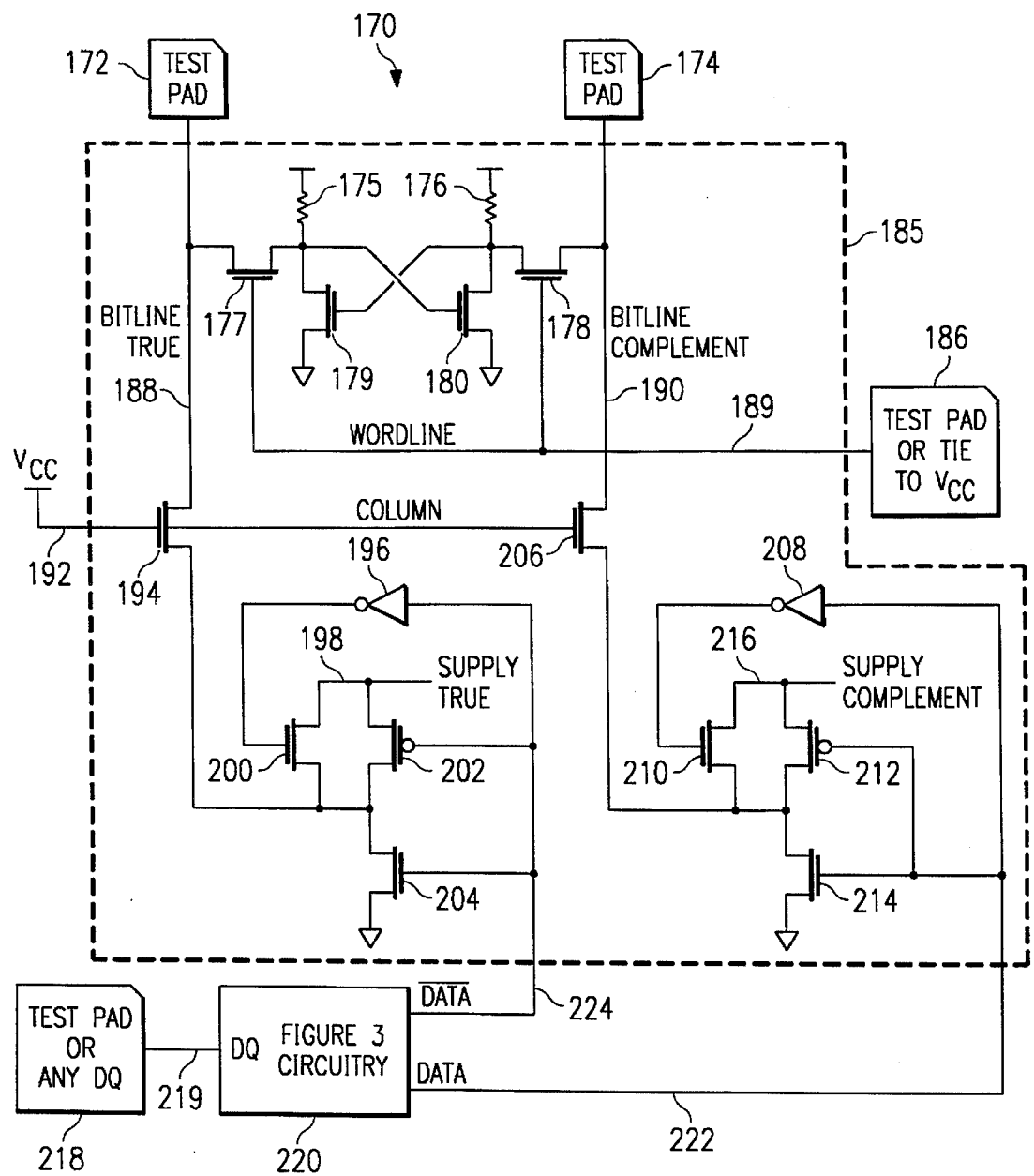
FIG. 6 is a schematic diagram of a dummy memory structure, according to the present invention.

The dummy memory structure 170 of FIG. 6 has circuitry 185 which is analogous to the circuitry of FIG. 1 connected to block 220 which contains circuitry analogous to Data In Buffer circuitry 70 of FIG. 3. Circuitry 185, like circuitry 10 of FIG. 1, contains a memory cell having a first resistor 175, a second resistor 176, a first transistor 177 and a second transistor 178, and cross-coupled transistors 179 and 180. The memory cell is located between bitline true 188 and bitline complement 190 through connections to a source/drain of transistors 177 and 178, respectively. The voltage of bitline true 188 may be monitored via Test Pad 172, while the voltage of bitline complement 190 may be monitored via Test Pad 174.

The gate of transistors 177 and 178 are connected to Wordline bus 189, the voltage of which may be monitored through Test Pad 186 which may also be tied to a supply voltage such as Vcc if so desired. The gates of column select transistors 206 and 194 are connected together by Column bus 192 and pulled up to Vcc potential as shown. The Write Driver True, made up of transistors 200, 202, 204, and inverter 196, is supplied with Supply True bus signal 198 through a first source/drain of transistors 200 and 202. Write Driver True is connected to column select transistor 194 by a second source/drain of transistors 200 and 202 and a first source/drain of transistor 204. A second source/drain of transistor 204 is connected to ground potential Vss. The Data Complement bus 224 provided by Block 220 feeds the gate of transistor 200 through inverter 200 as well as the gates of transistors 202 and 204. The Write Driver Complement, made up of transistors 210, 212, 214, and inverter 208 is supplied with Supply Complement bus signal 216 through a first source/drain of transistors 210 and 212. Write Driver Complement is connected to load transistor 206 by a second source/drain of transistors 210 and 212 and a first source/drain of transistor 214. A second source/drain of transistor 214 is connected to ground potential, Vss. Data bus 222 provided by the FIG. 3 circuitry of block 220 feeds the gate of transistor 210 through inverter 208 as well as the gates of transistors 214 and 212. The FIG. 3 circuitry of block 220 is driven by a DQ input signal 219 provided to Test Pad 218, which may be a DQ pin of the memory device. The Data bus 222 output signal of block 220 is analogous to Data bus signal 130 of FIG. 3. Similarly, the Data Complement bus 224 of block 220 is analogous to Data Complement bus signal 102 of FIG. 3.

The dummy memory structure circuit 170 of FIG. 6 provides the advantage of being able to monitor bitline voltage levels on Test Pads 172 and 174 after supplying an input signal on Test Pad 218. Additionally, if it is necessary to perform bitline testing with the Wordline bus 189 off, this may be accomplished through appropriate manipulation of a signal on Test Pad 186. It may be desirable to turn off Wordline bus 22 of FIG. 1 during a long write test, for instance, where address true and address complement may be jammed to a de-asserting state or where a test signal is an input signal in the row decode path of the memory device. Thus, single bit analysis as well as long write testing, row to column shorts and other memory device defects may be analyzed.

The test mode to effectuate internal cell electrical measurements of the present invention may be used in a variety of applications to characterize internal cell performance of a memory integrated circuit memory device. Yield improvement analysis, reliability analysis, and customer/field returns of faulty memory devices for failure analysis may directly benefit from the present invention. Additionally, the efficiency of the present invention allows for examination of many more cells than previous to gain more statistically significant data on single bit failures.

While the invention has been particularly shown and described with reference to a preferred embodiment, it will be understood by those skilled in the art that various changes in form and detail may be made therein without departing from the spirit and scope of the invention.

What is claimed is:

1. A method for testing single bits of an integrated circuit memory device, comprising the steps of:
    entering a test mode by setting a test mode signal of the integrated circuit memory device to a first logic state;
    turning off a bitline load device of a memory cell of the integrated circuit memory device, wherein the memory cell of the integrated circuit memory device is connected to the bitline which is connected to a first supply voltage through the bitline load device;
    selecting, by address selection, a single bit of the memory cell of the integrated circuit memory device to be tested, wherein the bitline is associated with the single bit;
    placing the integrated circuit memory device into a write mode;
    setting a plurality of bitlines of the integrated circuit memory device not associated with the single bit to a second logic state, wherein the first logic state is not equal to the second logic state;
    connecting the bitline associated with the single bit to a supply bus, wherein the supply bus is connected to a test pad; and
    monitoring an electrical characteristic of the single bit on the test pad.

2. The method of claim 1, wherein the logic states of the plurality of bitlines of the integrated circuit memory device not associated with the single bit are defined when entering the test mode.

3. The method of claim 1, wherein the step of selecting the single bit of the integrated circuit memory device is accomplished by setting a wordline bus connected to the memory cell to the first logic state and by setting a select bus which controls a select device to the first logic state.

4. The method of claim 3, wherein the select device is a column select transistor and the select bus is a column bus.

5. The method of claim 1, wherein the step of setting a plurality of bitlines not associated with the single bit to the second logic state is accomplished by a buffer circuit.

6. The method of claim 1, wherein the step of monitoring an electrical characteristic of the single bit on the test pad allows monitoring an electrical characteristic of the bitline without microprobing.

7. A method for testing single bits of an integrated circuit memory device, comprising the steps of:
    entering a test mode by setting a test mode signal of the integrated circuit memory device to be tested to a first logic state;
    turning off a first bitline load device and a second bitline load device of a memory cell of the integrated circuit memory device, wherein the memory cell of the integrated circuit memory device is connected to the bitline true and the bitline complement, and the bitline true is connected to a first supply voltage through the first bitline load device and the bitline complement is connected to the first supply voltage through the second bitline load device;
    selecting, by address selection, a single bit of the memory cell of the integrated circuit memory device to be tested, wherein the bitline true and the bitline complement are associated with the single bit;
    placing the integrated circuit memory device into a write mode;
    setting a plurality of bitlines true and a plurality of bitlines complement of the integrated circuit memory device not associated with the single bit to a second logic state;
    connecting the bitline true and the bitline complement associated with the single bit to a supply true bus and a supply complement bus, respectively, wherein the supply true bus is connected to a first test pad and the supply complement bus is connected to a second test pad; and
    monitoring an electrical characteristic of the single bit on the first test pad and the second test pad.

8. The method of claim 7, wherein the logic states of the plurality of bitlines true and bitlines complement of the integrated circuit memory device not associated with the single bit are defined when entering the test mode.

9. The method of claim 7, wherein the step of selecting the single bit of the integrated circuit memory device is accomplished by setting a wordline bus connected to the memory cell to the first logic state and by setting a select bus which controls a first select device and a second select device to the first logic state, wherein the first select device is connected to the bitline true and the second select device is connected to the bitline complement.

10. The method of claim 9, wherein the first select device is a first column select transistor, the second select device is a second column select transistor, and the select bus is a column bus.

11. The method of claim 7, wherein the step of setting a plurality of bitlines true and a plurality of bitlines complement of the integrated circuit memory device not associated with the single bit to a second logic state is accomplished by a buffer circuit.

12. The method of claim 7, wherein the step of connecting the bitline true to the supply true bus is accomplished by a first select device connected to the bitline true and a first driver connected to the first select device, and the step of connecting the bitline complement to the supply complement bus is accomplished by a second select device connected to the bitline complement and a second driver connected to the second select device.

13. The method of claim 7, wherein the step of monitoring an electrical characteristic of the single bit on the first test pad and the second test pad allows monitoring an electrical characteristic of the bitline true and an electrical characteristic of the bitline complement associated with the single bit without microprobing.

14. The method of claim 13, wherein the electrical characteristic of the bitline true is a voltage and the electrical characteristic of the bitline complement is a voltage.

15. The method of claim 13, wherein the electrical characteristic of the bitline true is a current and the electrical characteristic of the bitline complement is a current.

16. An integrated circuit memory device structure for testing single bits of an integrated circuit memory device, comprising:

a memory cell of the integrated circuit memory device;

a bitline load device connected to a first supply voltage and controlled by a test mode signal, wherein when the test mode signal is equal to a first logic state the integrated circuit memory device is in a test mode during which a single bit of the memory cell may be tested;

a wordline bus connected to the memory cell;

a bitline connected to the bitline load device and the memory cell;

a select device connected to the bitline and controlled by a select bus;

a driver connected to the select device by a bus, wherein the driver receives a data input signal and is controlled by a voltage supply signal electrically connected to a test pad and an electrical characteristic of the single bit may be monitored on the test pad; and means for setting a plurality of bitlines true and a plurality of bitlines complement of the integrated circuit memory device not associated with the single bit to a second logic state during the test mode.

17. An integrated circuit memory device structure for testing single bits of an integrated circuit memory device, comprising:

a memory cell of the integrated circuit memory device;

a first bitline load device connected to a first supply voltage and controlled by a test mode signal, wherein when the test mode signal is equal to a first logic state the integrated circuit memory device is in a test mode during which a single bit of the memory cell may be tested;

a second bitline load device connected to the first supply voltage and controlled by the test mode signal;

a wordline bus connected to the memory cell;

a bitline true connected to the first bitline load device and to the memory cell;

a bitline complement connected to the second bitline load device and to the memory cell;

a first select device connected to the bitline true and controlled by a select bus;

a second select device connected to the bitline complement and controlled by the select bus;

a first driver connected to the first select device by a true bus, wherein the first driver receives a data complement input signal and is controlled by a voltage supply true signal electrically connected to a first test pad;

a second driver connected to the second select driver by a complement bus, wherein the second driver receives a data true input signal and is controlled by a voltage supply complement signal electrically connected to a second test pad, wherein an electrical characteristic of the single bit may be monitored on the first test pad and the second test pad; and means for setting a plurality of bitlines true and a plurality of bitlines complement of the integrated circuit memory device not associated with the single bit to a second logic state during the test mode.

18. The structure of claim 17, wherein the voltage supply true signal is supplied to a plurality of drivers of the integrated circuit memory device.

19. The structure of claim 17, wherein the voltage supply complement signal is supplied to a plurality of drivers of the integrated circuit memory device.

20. The structure of claim 17, wherein the first bitline load device is a transistor and the second bitline load device is a transistor.

21. The structure of claim 17, wherein the memory cell is a Poly R memory cell.

22. The structure of claim 17, wherein the memory cell is a 6T memory cell.

23. The structure of claim 17, wherein the first driver comprises a first transistor and a second transistor which form an first inverter, the first transistor is controlled by the voltage supply true signal, the second transistor is connected to a second supply voltage, and a gate of the first transistor and a gate of the second transistor are connected to a data complement input signal; and wherein the second driver comprises a third transistor and a fourth transistor which form a second inverter, the third transistor is controlled by the voltage supply complement signal, the fourth transistor is connected to the second supply voltage, and a gate of the third transistor and a gate of the fourth transistor are connected to a data true input signal.

24. The structure of claim 23, wherein the first driver is a write driver true, the true bus is a write true bus, the second driver is a write driver complement, and the complement bus is a write complement bus.

25. The structure of claim 17, wherein the supply true bus signal is electrically connected to the first test pad by a first switching transistor circuit and the supply complement bus signal is electrically connected to the second test pad by a second switching transistor circuit.

26. The structure of claim 25, wherein the first switching transistor circuit comprises a first transistor and a second transistor, with a first terminal of the first transistor connected to the first supply voltage, a second terminal of the first transistor connected to the supply true bus signal, and a gate of the first transistor controlled by a complementary test mode signal, with a first terminal of the second transistor connected to the first test pad, a second terminal of the second transistor connected to the second terminal of the first transistor and the supply true bus signal, and a gate of the second transistor controlled by the test mode signal; and wherein the second switching transistor circuit comprises a third transistor and a fourth transistor, with a first terminal of the third transistor connected to the first supply voltage, a second terminal of the third transistor connected to the supply complement bus signal, and a gate of the third transistor controlled by the test mode signal, with a first terminal of the fourth transistor connected to the second test pad, a second terminal of the fourth transistor connected to the second terminal of the third transistor and the supply complement bus signal, and a gate of the fourth transistor controlled by a complementary test mode signal.

27. The structure of claim 17, wherein the first test pad and the second test pad are downbonded to the first supply voltage.

28. The structure of claim 17, wherein the first driver and the second driver allow a voltage level on the bitline true and the bitline complement, $V_{BL}$, defined as: $0 \leq V_{BL} \leq V_{CC} - V_{TN}$, wherein Vcc is representative of the first supply voltage and $V_{TN}$ is representative of a voltage threshold of a n-channel transistor.

29. The structure of claim 17, wherein the first driver comprises a first transistor, a second transistor, a third transistor, a first inverter, with a gate of the first transistor connected to a gate of the second transistor, with a first terminal of the first inverter connected to the gate of the first transistor and the gate of the second transistor, with a second terminal of the first inverter connected to a gate of the third transistor, with the first inverter, the first transistor, and the second transistor controlled by the data complement input signal, with a first terminal of the first transistor and a first terminal of the third transistor connected to the voltage supply true signal, with a second terminal of the first transistor, a first terminal of the second transistor, and a second terminal of the third transistor connected to the true bus, and a second terminal of the second transistor connected to a second supply voltage.

30. The structure of claim 17, wherein the second driver comprises a first transistor, a second transistor, a third transistor, a first inverter, with a gate of the first transistor connected to a gate of the second transistor, with a first terminal of the first inverter connected the gate of the first transistor and the gate of the second transistor, with a second terminal of the first inverter connected to a gate of the third transistor, with the first inverter, the first transistor, and the second transistor controlled by the data true input signal, with a first terminal of the first transistor and a first terminal of the third transistor connected to the voltage supply complement signal, with a second terminal of the first transistor, a first terminal of the second transistor, and a second terminal of the third transistor connected to the complement bus, and a second terminal of the second transistor connected to a second supply voltage.

31. The structure of claim 17, wherein a power supply of a logic element which controls the wordline bus connected to the memory cell may be modulated by connecting the power supply of the wordline bus to a first terminal of a first transistor, connecting a second terminal of the first transistor to a first terminal of a second transistor with the second terminal of the first transistor and the first terminal of the second transistor connected to the wordline bus, driving a gate of the first transistor and a gate of the second transistor with a logic signal, and connecting a second terminal of the second transistor to a second supply voltage.

32. The structure of claim 17, wherein the means for setting a plurality of bitlines true and a plurality of bitlines complement of the integrated circuit memory device not associated with the single bit to the second logic state is a buffer circuit associated with each bitline true of the plurality of bitlines true and each bitline complement of the plurality of bitlines complement.

33. The structure of claim 32, wherein either the bitline true or the bitline complement is not equal to a ground potential.

34. The structure of claim 32, wherein the buffer circuit comprises:

a pad connected to an output pin of the integrated circuit memory device;

a TTL (transistor-transistor logic) buffer connected to the pad, wherein a signal on the pad is an input signal of the TTL buffer;

a first inverter connected to the TTL buffer, which has an output signal of the TTL buffer as an input signal;

a passgate connected to the first inverter and controlled by the test mode signal and a test mode complement signal, wherein the test mode signal and the test mode complement signal determine when an output signal of the first inverter will be inverted and presented as a first input signal to a first logic element also having the test mode signal as a second input signal and wherein the output signal of the first inverter passes through a latch comprised of a second inverter connected to a third inverter before being presented as the first input signal to the first logic element;

a second logic element having an output enable input signal, the test mode as an input signal, and an output signal;

a third logic element having the output signal of the second logic element as a first input signal, a write signal as a first input signal, and an output signal;

a first transistor, a second transistor, a third transistor, a fourth transistor, a fifth transistor, and a sixth transistor, wherein a gate of the first transistor and a gate of the sixth transistor are controlled by an output signal of the first logic element, a first terminal of the first transistor is connected to the first supply voltage, and a second terminal of the first transistor is connected to a first terminal of the second transistor and a first terminal of the third transistor; wherein a gate of the second transistor and a gate of the fourth transistor are controlled by the output signal of the TTL buffer; wherein a gate of the third transistor and a gate of the fifth transistor are controlled by the output signal of the third logic element; wherein a second terminal of the second transistor, a second terminal of the third transistor, a first terminal of the fourth transistor, a first terminal of the sixth transistor are connected to the data complement input signal; wherein a second terminal of the fourth transistor is connected to a first terminal of the fifth transistor; and wherein a second terminal of the fifth transistor and a second terminal of the sixth transistor are connected to a second supply voltage; and a seventh transistor, an eighth transistor, a ninth transistor, a tenth transistor, an eleventh transistor, and a twelfth transistor, wherein a gate of the seventh transistor is connected to the output signal of the first logic element, the gate of the first transistor, the gate of the sixth transistor and a gate of the twelfth transistor; wherein a first terminal of the seventh transistor is connected to the first supply voltage; wherein a second terminal of the seventh transistor is connected to a first terminal of the eighth transistor and a first terminal of the ninth transistor; wherein a gate of the eighth transistor and a gate of the tenth transistor are controlled by an inverse signal of the output signal of the TTL buffer; wherein a gate of the ninth transistor and a gate of the eleventh transistor are controlled by the output signal of the third logic element; wherein a second terminal of the eighth transistor, a second terminal of the ninth transistor, a first terminal of the tenth transistor, and a first terminal of the twelfth transistor are connected to the data true input signal; wherein a second terminal of the tenth transistor is connected to a first terminal of the eleventh transistor; and wherein a second terminal of the eleventh transistor and a second terminal of the twelfth transistor are connected to the second supply voltage.

35. The structure of claim 34, wherein the TTL buffer is an inverter, the first logic element is an AND logic gate, the second logic element is a NAND logic gate, and the third logic element is an AND logic gate.

36. The structure of claim 34, wherein the first transistor, the second transistor, the third transistor, the seventh transistor, the eighth transistor and the ninth transistor are p-channel transistors; and wherein the fourth transistor, the fifth transistor, the sixth transistor, the tenth transistor, the eleventh transistor and the twelfth transistors are n-channel transistors.

37. A structure for monitoring the bitline voltages of an integrated circuit memory device, comprising:

a memory cell of the integrated circuit memory device;

a bitline true connected to the memory cell;

a bitline complement connected to the memory cell;

a wordline bus connected to the memory cell;

a first select device connected to the bitline true and controlled by a select bus connected to a first supply voltage;

a second select device connected to the bitline complement and controlled by the select bus;

a first driver connected to the first select device by a true bus and connected to a second test pad, wherein the first driver receives a data complement input signal and is controlled by a voltage supply true signal;

a second driver connected to the second select driver by a complement bus and connected to a third test pad, wherein the second driver receives a data true input signal and is controlled by a voltage supply complement signal;

a buffer circuit which provides the data complement input signal to the first driver and the data true input signal to the second driver; and a fourth test pad, wherein a signal on the fourth test pad is an input signal of the buffer circuit.

38. A structure for monitoring the bitline voltages of an integrated circuit memory device, comprising:

a memory cell of the integrated circuit memory device;

a bitline true connected to the memory cell;

a bitline complement connected to the memory cell;

a wordline bus connected to the memory cell;

a first select device connected to the bitline true and controlled by a select bus connected to a first supply voltage;

a second select device connected to the bitline complement and controlled by the select bus;

a first driver connected to the first select device by a true bus and connected to a second test pad, wherein the first driver receives a data complement input signal and is controlled by a voltage supply true signal;

a second driver connected to the second select driver by a complement bus and connected to a third test pad, wherein the second driver receives a data true input signal and is controlled by a voltage supply complement signal;

a buffer circuit which provides the data complement input signal to the first driver and the data true input signal to the second driver;

a fourth test pad, wherein a signal on the fourth test pad is an input signal of the buffer circuit;

a pad connected to an output pin of the integrated circuit memory device;

a TTL (transistor-transistor logic) buffer connected to the pad, wherein a signal on the pad is an input signal of the TTL buffer;

a first inverter connected to the TTL buffer, which has an output signal of the TTL buffer as an input signal;

a passgate connected to the first inverter and controlled by the test mode signal and a test mode complement signal, wherein the test mode signal and the test mode complement signal determine when an output signal of the first inverter will be inverted and presented as a first input signal to a first logic element also having the test mode signal as a second input signal and wherein the output signal of the first inverter passes through a latch comprised of a second inverter connected to a third inverter before being presented as the first input signal to the first logic element;

a second logic element having an output enable input signal, the test mode as an input signal, and an output signal;

a third logic element having the output signal of the second logic element as a first input signal, a write signal as a second input signal, and an output signal;

a first transistor, a second transistor, a third transistor, a fourth transistor, a fifth transistor, and a sixth transistor, wherein a gate of the first transistor and a gate of the sixth transistor are controlled by an output signal of the first logic element, a first terminal of the first transistor is connected to the first supply voltage, and a second terminal of the first transistor is connected to a first terminal of the second transistor and a first terminal of the third transistor; wherein a gate of the second transistor and a gate of the fourth transistor are controlled by the output signal of the TTL buffer; wherein a gate of the third transistor and a gate of the fifth transistor are controlled by the output signal of the third logic element; wherein a second terminal of the second transistor, a second terminal of the third transistor, a first terminal of the fourth transistor, a first terminal of the sixth transistor are connected to the data complement input signal; wherein a second terminal of the fourth transistor is connected to a first terminal of the fifth transistor; and wherein a second terminal of the fifth transistor and a second terminal of the sixth transistor are connected to a second supply voltage; and a seventh transistor, an eighth transistor, a ninth transistor, a tenth transistor, an eleventh transistor, and a twelfth transistor, wherein a gate of the seventh transistor is connected to the output signal of the first logic element, the gate of the first transistor, the gate of the sixth transistor and a gate of the twelfth transistor; wherein a first terminal of the seventh transistor is connected to the first supply voltage; wherein a second terminal of the seventh transistor is connected to a first terminal of the eighth transistor and a first terminal of the ninth transistor; wherein a gate of the eighth transistor and a gate of the tenth transistor are controlled by an inverse signal of the output signal of the TTL buffer; wherein a gate of the ninth transistor and a gate of the eleventh transistor are controlled by the output signal of the third logic element; wherein a second terminal of the eighth transistor, a second terminal of the ninth transistor, a first terminal of the tenth transistor, and a first terminal of the twelfth transistor are connected to the data true input signal; wherein a second terminal of the tenth transistor is connected to a first terminal of the eleventh transistor; and wherein a second terminal of the eleventh transistor and a second terminal of the twelfth transistor are connected to the second supply voltage.

39. The structure of claim 38, wherein the TTL buffer is an inverter, the first logic element is an AND logic gate, the second logic element is a NAND logic gate, and the third logic element is an AND logic gate.

40. The structure of claim 38, wherein the first transistor, the second transistor, the third transistor, the seventh transistor, the eighth transistor and the ninth transistor are p-channel transistors; and wherein the fourth transistor, the fifth transistor, the sixth transistor, the tenth transistor, the eleventh transistor and the twelfth transistors are n-channel transistors.

* * * * *